United States Patent
Sreeram et al.

(10) Patent No.: US 11,615,821 B1
(45) Date of Patent: Mar. 28, 2023

(54) GHOST COMMAND SUPPRESSION IN A HALF-FREQUENCY MEMORY DEVICE

(71) Applicant: Micron Technology, Inc., Boise, ID (US)

(72) Inventors: Navya Sri Sreeram, Plano, TX (US); Kallol Mazumder, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 17/513,830

(22) Filed: Oct. 28, 2021

(51) Int. Cl.
*G11C 7/10* (2006.01)

(52) U.S. Cl.
CPC .......... *G11C 7/1039* (2013.01); *G11C 7/1009* (2013.01); *G11C 7/1012* (2013.01); *G11C 7/1066* (2013.01); *G11C 7/1093* (2013.01)

(58) Field of Classification Search
CPC ... G11C 7/1039; G11C 7/1009; G11C 7/1012; G11C 7/1066; G11C 7/1093
USPC ...................................................... 365/233.1
See application file for complete search history.

(56) References Cited

U.S. PATENT DOCUMENTS

| | | | |
|---|---|---|---|
| 8,897,090 B2* | 11/2014 | Oh | G11C 7/10 365/221 |
| 10,162,406 B1* | 12/2018 | Mazumder | G06F 3/002 |
| 2017/0110173 A1* | 4/2017 | Matsuno | G11C 7/1039 |
| 2019/0066758 A1* | 2/2019 | Gajapathy | G11C 7/109 |
| 2021/0295885 A1* | 9/2021 | Deshpande | G11C 7/222 |
| 2022/0230684 A1* | 7/2022 | Deshpande | G11C 7/1009 |

* cited by examiner

*Primary Examiner* — Fernando Hidalgo
(74) *Attorney, Agent, or Firm* — Fletcher Yoder, P.C.

(57) ABSTRACT

A memory device includes a command interface configured to receive a two-cycle command from a host device via multiple command address bits. The memory device also includes a command decoder configured to decode a first portion of the multiple command address bits in a first cycle of the two-cycle command. The command decoder includes mask circuitry. The mask circuitry includes mask generation circuitry configured to generate a mask signal. The mask circuitry also includes multiplexer circuitry configured to apply the mask signal to block the command decoder from decoding a second portion of the multiple command address bits in a second cycle of the two-cycle command.

25 Claims, 11 Drawing Sheets

GHOST COMMAND SUPPRESSION IN A HALF-FREQUENCY MEMORY DEVICE

BACKGROUND

Field of the Present Disclosure

Embodiments of the present disclosure relate generally to the field of semiconductor devices. More specifically, embodiments of the present disclosure relate to mask circuitry that masks command address bits that are not to be decoded as commands from being decoded in half-frequency circuits of a memory device.

Description of Related Art

Semiconductor devices (e.g., memory devices) utilize timings with shifts of data signals, data strobes, commands, and/or other signals to perform operations. The commands are decoded and captured using command address bits. Some memory devices that utilize addresses for their operations, such as Write (WR), Write Pattern (WRP), Activate, and Read commands, use command address bits that are to be captured in the second cycle based on the decoded commands. These second cycle command address bits may not require decoding and should not be decoded. However, some of the command address bits in the second cycle may appear as a first cycle of a ghost command when incorrectly decoded even though they are not actually part of a first cycle of a command to be decoded to start the command. In other words, the memory device may be unable to distinguish whether data on the command address bits are to be decoded as part of a newly received command without some masking techniques.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, command address bits of a two cycle command may be captured in successive cycles of a system clock. For instance, the bits in the second cycle may correspond to options and/or an address of memory to be used to perform the command (e.g., write, read, etc.). However, the bits captured in the second cycle may appear like bits from a first cycle that indicate a new command. These ghost commands may be incorrectly decoded if not suppressed. Furthermore, suppressing or masking these ghost command may be made more complicated due to half-frequency mode of a memory device using the masking. Half-frequency modes mean that the memory device includes two pipelines that each operate at a frequency that is half of the frequency of the system clock. Additionally, the half-frequency mode may include a 1N mode or a 2N mode. In the 1N mode, the two cycles of the two-cycle command are received in different pipelines on successive cycles of the system clock. In the 2N mode, the two cycles of the two-cycle command are received in the same pipeline on nonconsecutive cycles of the system clock corresponding to a first pipeline (e.g., even pipeline following even cycles of system clock) with the cycles separated by another cycle of the system clock corresponding to a second pipeline (e.g., odd pipeline following odd cycles of system clock).

Figure 1:
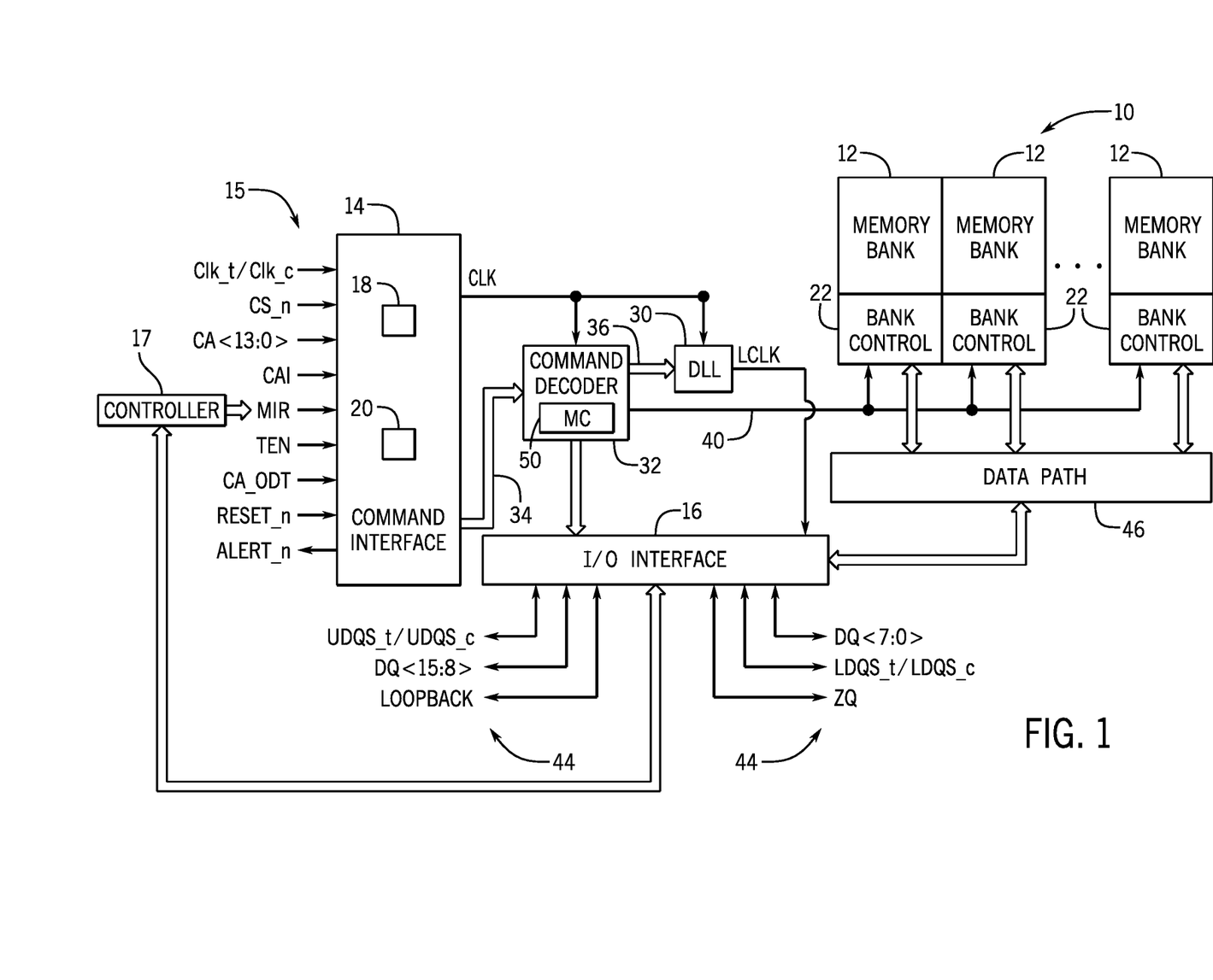
FIG. 1 is a simplified block diagram illustrating certain features of a memory device having mask circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external host device, such as a controller 17 that may be embodied as a processor and/or other host device. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complimentary or bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) 30. The DLL 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. Additionally or alternatively, the command decoder may send internal write signals 41 to the IO interface 16. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands. As previously discussed, the command decoder 32 may include at least one mask circuitry 50 that determines and/or masks whether data on the CA<13:0> bits correspond to a valid incoming command or to a "ghost" command where incoming data on the CA<13:0> looks like a command but is actually an address or other data. The mask circuitry 50 may utilize historical commands to determine whether the data is a valid command or a ghost command.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n)

from the memory device 10 may be used as an input pin during certain operations, such as the connectivity test mode executed using the TEN signal, as described above.

Data may be sent to and from the memory device 10, utilizing the command and clocking signals discussed above, by transmitting and receiving signals 44 (e.g., data and/or strobes to capture the data) through the TO interface 16. More specifically, the data may be sent to or retrieved from the memory banks 12 over the data path 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS. The DQS is driven by the external processor or controller sending the data (e.g., for a write command) or by the memory device 10 (e.g., for a read command). For read commands, the DQS is effectively additional data output (DQ) signals with a predetermined pattern. For write commands, the DQS is used as clock signals to capture the corresponding input data. As with the clock signals (Clk_t and Clk_c), the DQS may be provided as a differential pair of data strobe signals (DQS_t and DQS_c) to provide differential pair signaling during reads and writes. For certain memory devices, such as a DDR5 SDRAM memory device, the differential pairs of DQS may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the TO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
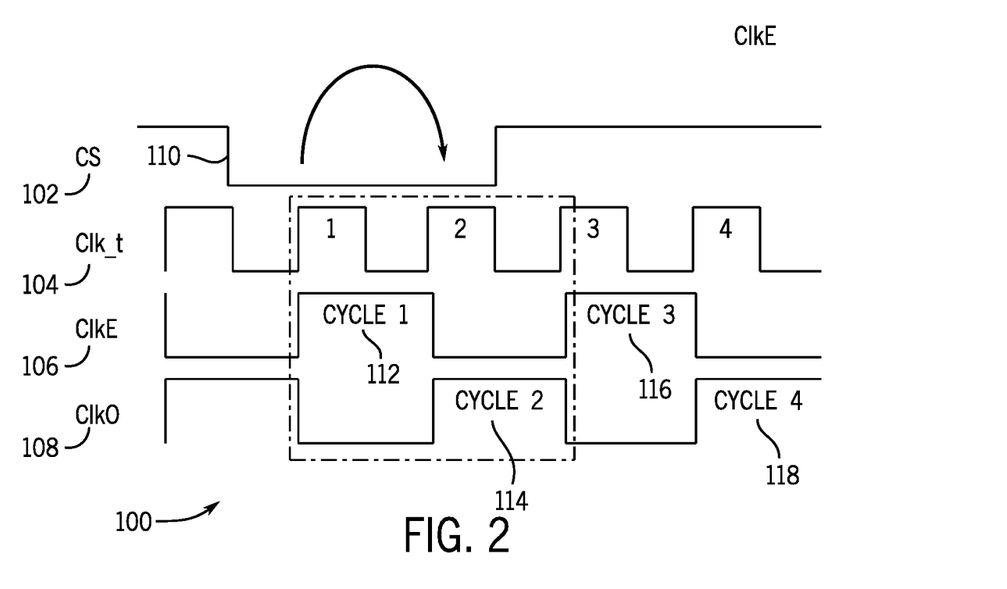
FIG. 2 is a timing diagram for a half-frequency mode of the memory device of FIG. 1 in 1N mode, in accordance with an embodiment.

FIG. 2 is an example timing diagram 100 for a half-frequency mode of a memory device in a 1N mode. The timing diagram 100 includes a chip select signal 102, the system clock (Clk_t) 104, an even clock (ClkE) 106 used to drive an even pipeline, and an odd clock (ClkO) 108 used to drive an odd pipeline. The chip select signal 102 may be asserted low (or high in some embodiments) when a command is issued. The even clock 106 and the odd clock 108 are derived from alternating pulses of the Clk_t 104 to create a clock with half of the frequency of the Clk_t 104. The chip select signal 102 is asserted in pulse 110 corresponding to a command (e.g., activate, read, or write command). Since the memory device 10 is in a 1N mode, the received command is sent over consecutive cycles of the Clk_t 104. The command may be a two-cycle command with the chip select signal 102 asserted for two cycles of the Clk_t 104. The first cycle of the Clk_t 104 corresponds to a pulse 112 of the even clock 106 in an even pipeline, and a second cycle of the Clk_t 104 corresponds to a pulse 114 of the odd clock 108 in an odd pipeline. A third cycle of the Clk_t 104 corresponds to a pulse 116 of the even clock 106, and a fourth cycle of the Clk_t 104 corresponds to a pulse 118 of the odd clock 108.

The command may be decoded from some of the CA bits (e.g., CA<5:0>) in the first cycle. If the command corresponds to a valid two-cycle command, the CA bits (e.g., CA<4:0>, CA<13:0>, or CA<13:6>) received in the second cycle of the Clk_t 104 are not to be decoded. If the CA bits are falsely decoded, the decoded command is a ghost command that is not actually a command but merely may appear to be a command. To stop the improper decoding of ghost commands, when a command is received in a pipeline (e.g., even pipeline), a mask signal may be generated in the mask circuitry 50 to block decoding of the ghost command upon receiving a two-cycle command. The mask circuitry 50 may determine whether the command is a two-cycle command using a pattern common to the two-cycle commands. For example, in some embodiments, all two-cycle commands may have a low chip select signal 102 and one or more CA bits (e.g., CA<1>) that may be used to decode whether the command is a two-cycle command. In the 1N mode, the mask circuitry 50 may generate a mask signal on even clock 106 cycles to block commands on the next odd cycle or vice versa.

Figure 3:
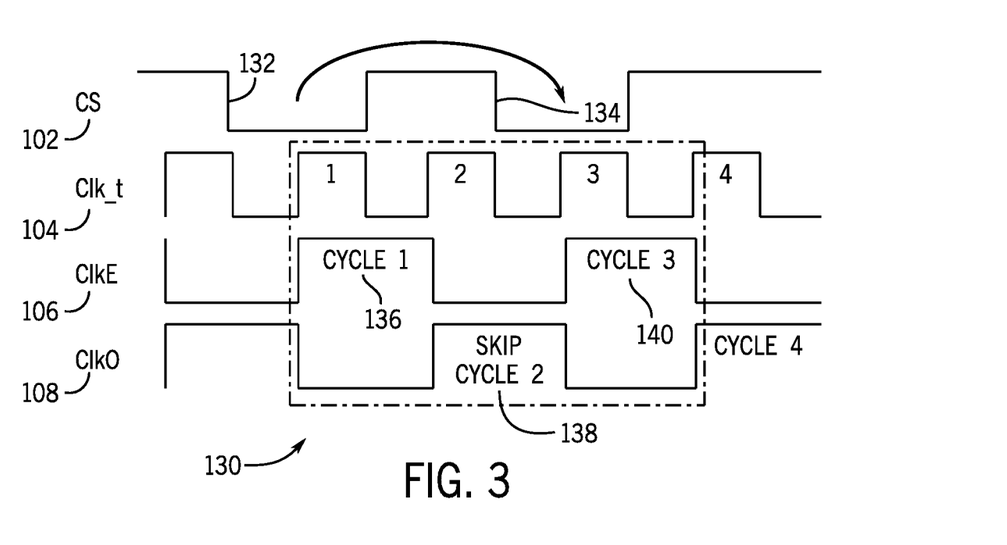
FIG. 3 is a timing diagram for a half-frequency mode of the memory device of FIG. 1 in 2N mode, in accordance with an embodiment.

FIG. 3 is an example timing diagram 130 for a half-frequency of a memory device in a 2N mode for a two-cycle command utilizing a mask signal to block decoding of the CA bits in a second cycle. Since the memory device is in a 2N mode, the received command is sent over alternating/nonconsecutive cycles of the Clk_t 104 skipping at least one cycle corresponding to the other pipeline. Thus, since the command is processed in a single pipeline (e.g., even pipeline), the chip select signal 102 may be asserted in alternating cycles of the Clk_t 104, as illustrated by pulses 132 and 134. A first cycle corresponding to pulse 136 after the falling edge of the pulse 132 is used to decode the first CA bits (e.g., CA<13:0>). A next cycle of the odd clock 108 corresponding to pulse 138 is skipped using a mask signal. The next CA bits (e.g., CA<13:0>) are captured in a third cycle (second cycle of even clock 106 after receipt of command) corresponding to pulse 140. In the 2N mode, the mask circuitry 50 may generate a mask signal on even clock 106 cycles to block commands on the next even cycle or may generate a mask signal on odd clock 108 cycles to block commands on the next odd cycle.

Figure 4:
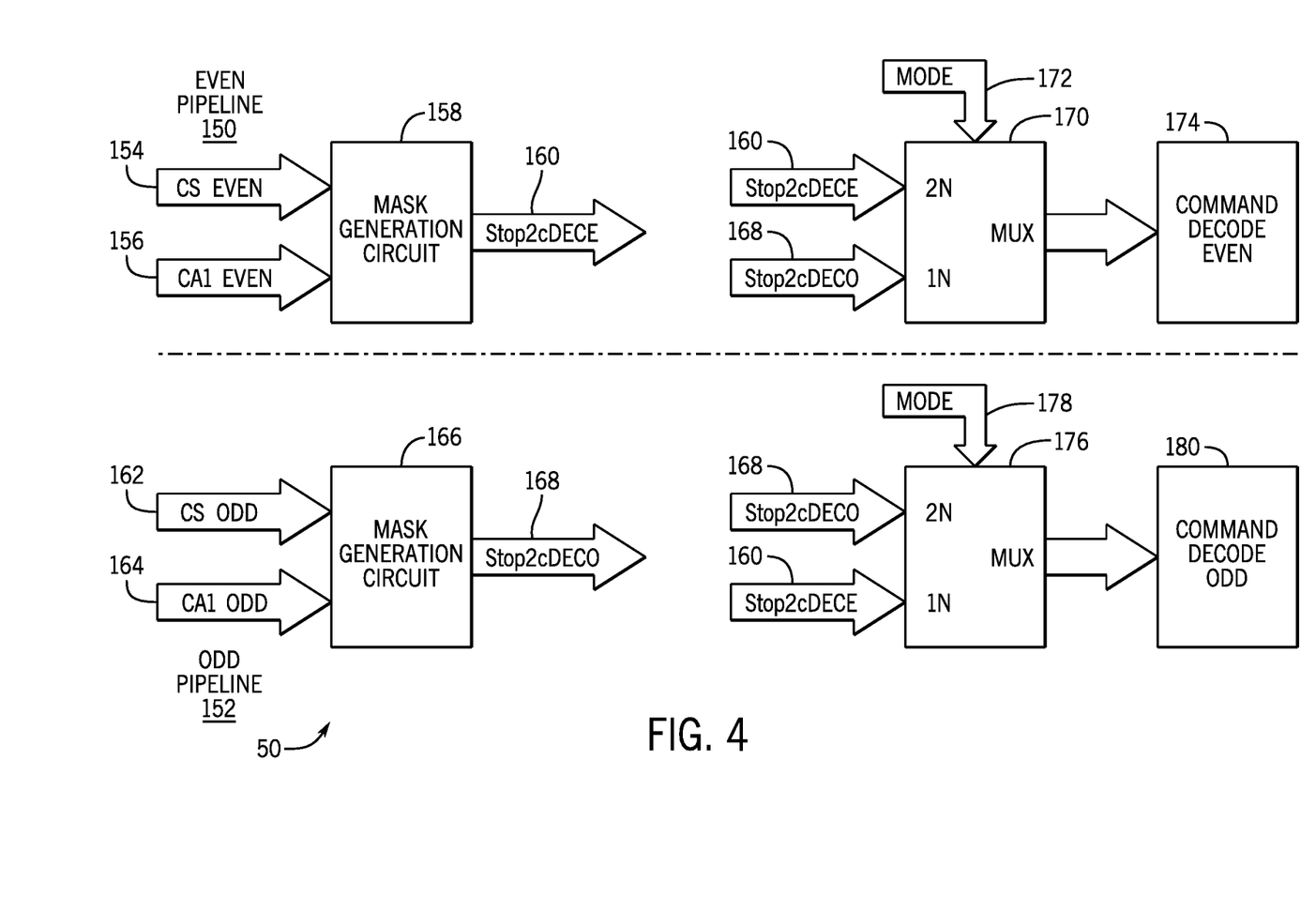
FIG. 4 is a block diagram of the mask circuitry of FIG. 1 having mask generation circuits and multiplexer circuits, in accordance with an embodiment.

FIG. 4 is a block diagram of the mask circuitry 50. As illustrated, the mask circuitry 50 is divided into an even pipeline 150 and an odd pipeline 152. The mask circuitry 50 is used to mask ghost commands from being decoded in the command decoder 32. The even pipeline 150 receives an even chip select signal 154 and even command address bit(s) 156 (e.g., CA<1>) at a mask generation circuit 158 in the even pipeline 150. As previously noted, the mask generation circuit 158 uses the even chip select signal 154 and the even command address bit(s) 156 to determine whether the received command is a two-cycle command. If the even chip select signal 154 and the even command address bit(s) 156 are both asserted, the mask generation circuit 158 may output an even mask signal (Stop2cDecE) 160 to block ghost commands from being decoded.

The odd pipeline 152 receives an odd chip select signal 162 and odd command bit(s) 164 (e.g., CA<1>) at a mask generation circuit 166 in the odd pipeline 152. As previously noted, the mask generation circuit 166 uses the odd chip select signal 162 and the odd command bit(s) 164 to determine whether the received command is a two-cycle command. If the odd chip select signal 162 and the odd command bit(s) 164 are both asserted, the mask generation circuit 166 may output an odd mask signal (Stop2cDecE) 168 to block ghost commands from being decoded.

Since the memory device 10 may be operated in an 1N or 2N mode, the even pipeline 150 utilizes the even mask signal 160 and the odd mask signal 168 by receiving both at a multiplexer circuit 170. The proper mask signal to be used is determined based on a mode select signal 172 used to indicate whether the memory device 10 is operating in the 1N or 2N mode. For instance, in 1N mode, the even pipeline 150 may be masked (e.g., odd mask signal 168) to block ghost commands in the even pipeline 150 after the odd pipeline 152 has received a valid command in a preceding cycle. However, in 2N mode, the even pipeline 150 may be masked (e.g., even mask signal 160) to block ghost commands in the even pipeline 150 after the even pipeline has received a valid command in a preceding cycle of the even clock 106. If no mask signal is generated, the command decoder 32 completes decoding of the command in the even pipeline as a command decode even 174.

Since the memory device 10 may be operated in an 1N or 2N mode, the odd pipeline 152 utilizes the odd mask signal 168 and the even mask signal 160 by receiving both at a multiplexer circuit 176. The proper mask signal is used based on a mode select signal 178 used to indicate whether the memory device 10 is operating in the 1N or 2N mode. The mode select signal 172 and the mode select signal 178 may be the same signal or separate signals. In 1N mode, the odd pipeline 152 may be masked (e.g., even mask signal 160) to block ghost commands in the odd pipeline 152 after the even pipeline 150 has received a valid command in a preceding cycle. However, in 2N mode, the odd pipeline 152 may be masked (e.g., odd mask signal 168) to block ghost commands in the odd pipeline 152 after the even pipeline has received a valid command in a preceding cycle of the even clock 106. If no mask signal is generated, the command decoder 32 completes decoding of the command in the odd pipeline 152 as a command decode odd 180.

Figure 5:
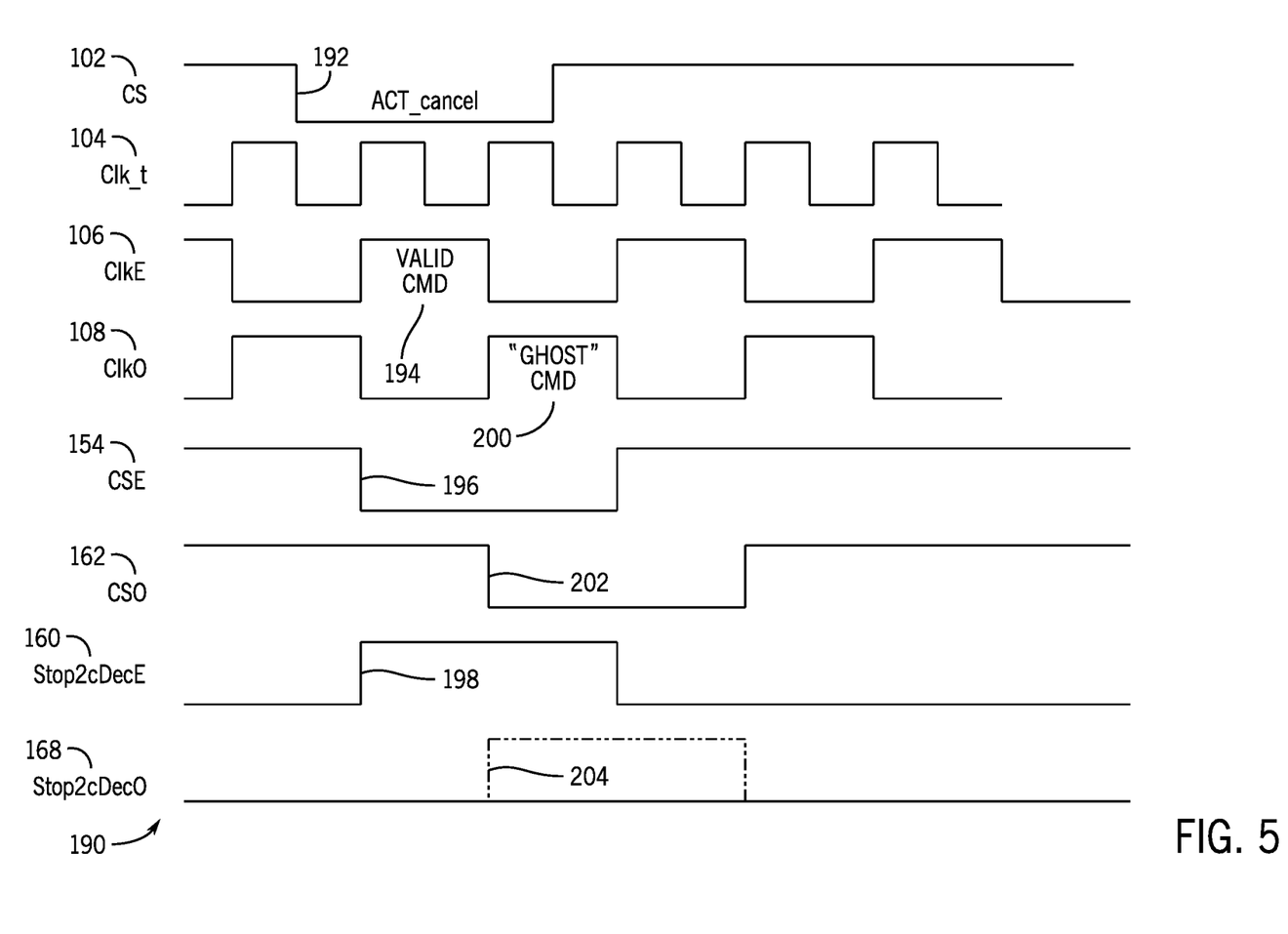
FIG. 5 is a timing diagram of a two-cycle command in the memory device of FIG. 1 in a 1N mode, in accordance with an embodiment.

Furthermore, when a ghost command is detected, the ghost command may be prevented from generating a new mask signal. For instance, FIG. 5 is a timing diagram 190 of an activate cancel command (or other two-cycle command) in a 1N mode. The timing diagram 190 includes the even chip select signal 154, the odd chip select signal 162, the even mask signal 160, and the odd mask signal 168. A pulse of the chip select signal 102 corresponds to a two-cycle command (e.g., an activate cancel command). Also, one or more CA bits (e.g., CA<1>) are assumed to be held to a value (e.g., 0) corresponding to a two-cycle command for the duration of the command. A first cycle 194 (of the even clock) is used to capture the chip select signal into the command decoder 32 and to cause a pulse 196 of the even chip select signal 154. Since the one or more CA bits are held to the value and the even chip select signal 154 is asserted, the mask circuitry 50 generates a pulse 198 on the odd mask signal 168 to block a ghost command from being decoded in a next clock cycle 200 even though the odd chip select signal 162 is asserted with pulse 202. Furthermore, although the odd chip select signal 162 and the one or more CA bits may be asserted, the odd mask signal 168 has pulse 204 suppressed by checking a one-cycle history showing that the previous cycle was a valid cycle and the current cycle is a ghost command.

Figure 6:
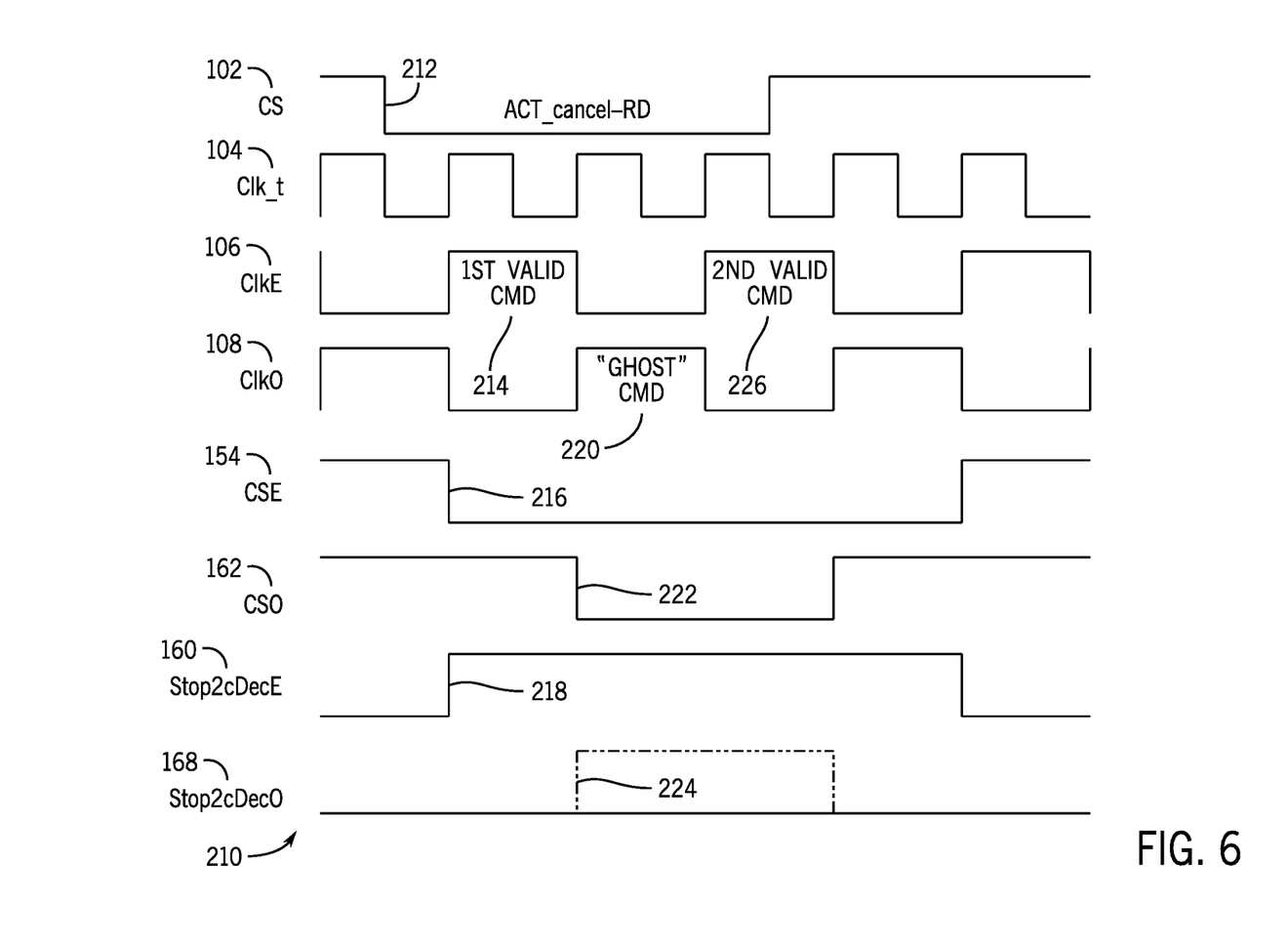
FIG. 6 is a timing diagram for the memory device of FIG. 1 that uses a two-cycle history to determine if a cycle corresponds to a valid command or a ghost command in a 1N mode, in accordance with an embodiment.

In some situations, a one-cycle history may not be sufficient to confirm that a current cycle may correspond to a ghost command. For instance, FIG. 6 is a timing diagram 210 that uses a two-cycle history to determine if a cycle corresponds to a valid command or a ghost command in the memory device 10 in a 1N mode. The chip select signal 102 is asserted in pulse 212 for respective activate cancel and read commands. In a next pulse 214 of the even clock 106, at least part of the bits of the valid command are captured and the even chip select signal 216 is asserted. Since the one or more CA bits are held to the value and the even chip select signal 154 is asserted, the mask circuitry 50 generates a pulse 218 on the even mask signal 160 to block a ghost command from being decoded in next clock cycle 220. Furthermore, although the odd chip select signal 162 and the one or more CA bits may be asserted, the odd mask signal 168 has pulse 224 suppressed by checking a one-cycle history showing that the previous cycle was a valid cycle and the current cycle is a ghost command.

In a next cycle 226 of the even clock 106, a second valid command (e.g., a read command) is received. Looking back to one or more CA bits and the chip select signal for the previous cycle of the odd clock 108 may cause the second valid command to appear as a ghost command. Instead, checking the even mask signal 160 from two cycles ago (e.g., previous cycle of the even clock 106), the mask circuitry 50 may confirm that the second valid command is valid rather than improperly identified as a ghost command. In other words, by looking at the chip select signal 222 from a previous cycle and at an even mask signal 160 generated two cycles earlier, the mask circuitry 50 may deduce whether a current cycle contains a valid command or a ghost command.

Figure 7:
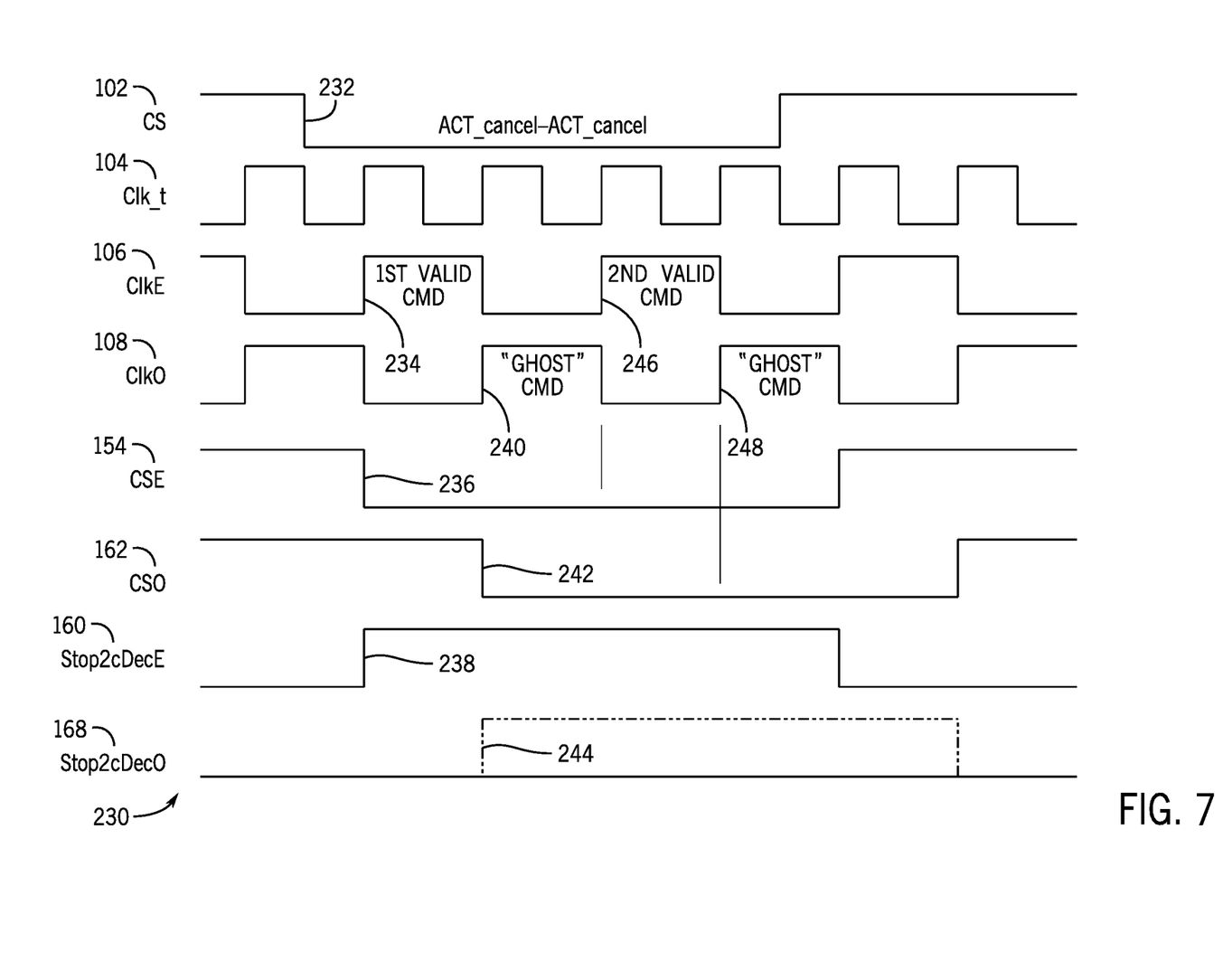
FIG. 7 is a timing diagram for the memory device of FIG. 1 that uses a two-cycle history to determine if a cycle corresponds to a valid command or a ghost command in a 1N mode with consecutive commands, in accordance with an embodiment.

Likewise, FIG. 7 is a timing diagram 230 that uses a two-cycle history to determine if a cycle corresponds to a valid command or a ghost command in a 1N mode. The chip select signal 102 is asserted in pulse 232 for consecutive activate cancel commands. In a next pulse 234 of the even clock 106, at least part of the bits of the valid command are captured and the even chip select signal 236 is asserted. Since the one or more CA bits are held to the value and the even chip select signal 154 is asserted, the mask circuitry 50 generates a pulse 238 on the even mask signal 160 to block a ghost command from being decoded in a next clock cycle 240 even though the odd chip select signal 162 is asserted with pulse 242. Furthermore, although the odd chip select signal 162 and the one or more CA bits may be asserted, the odd mask signal 168 has pulse 244 suppressed by checking two cycle history showing that the previous cycle was a valid cycle and current cycle is ghost command.

In a next cycle 246 of the even clock 106, a second valid activate cancel command is received. Looking back to one or more CA bits and the chip select signal for the previous cycle of the odd clock 108 may cause the second valid command to appear as a ghost command. Instead, checking the even mask signal 160 from two cycles ago (e.g., previous cycle of the even clock 106), the mask circuitry 50 may confirm that the second valid command is valid rather than improperly identified as a ghost command.

Figure 8:
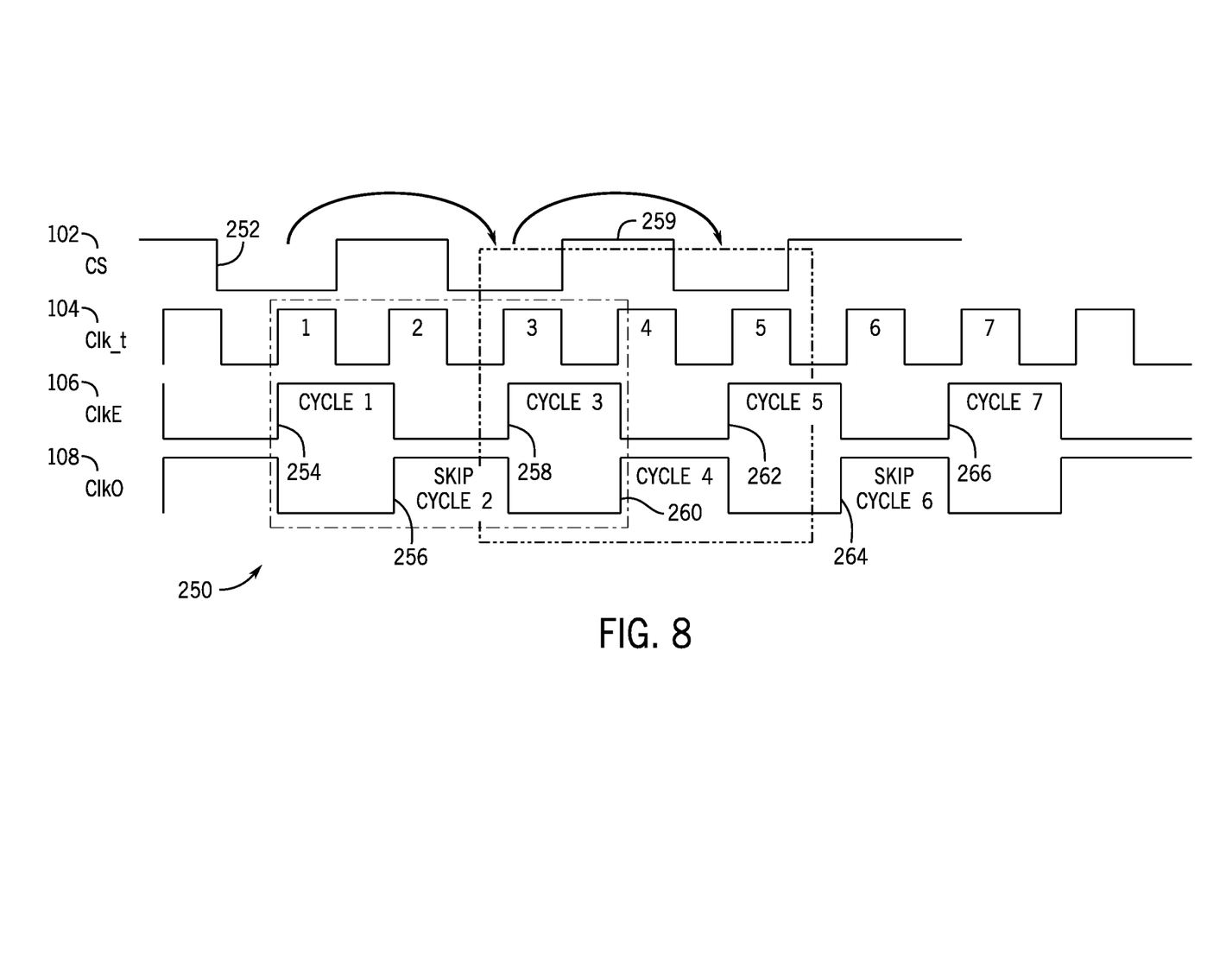
FIG. 8 is a timing diagram for the memory device of FIG. 1 receiving consecutive commands in a 2N mode, in accordance with an embodiment.

In 2N modes, the mask generation differs in that a pipeline (e.g., even pipeline 150) generates a mask for a next cycle in the pipeline. The other pipeline (e.g., odd pipeline 152) between the cycles is skipped. FIG. 8 is a timing diagram 250 for consecutive commands received in a 2N mode. Upon assertion of the chip select signal 102 via pulse 252, a valid two-cycle command is received at cycle1 254 in the even pipeline 150. Cycle2 256 in the odd pipeline 152 is skipped due to the 2N mode of the memory device 10. Cycle3 258 may contain a ghost command. Accordingly, a mask generated from the cycle1 254 may be used to block decoding of the ghost command in cycle2 256. Since the first valid command has completed, the chip select signal 102 returns to unasserted at point 259. After point 259, no valid command is received at cycle4 260. Instead, a next valid two-cycle command is received with cycle5 262 causing the cycle6 264 to be skipped and data with cycle1 266 to be blocked from decoding due to a mask signal occurring from the next valid two-cycle command.

Figure 9:
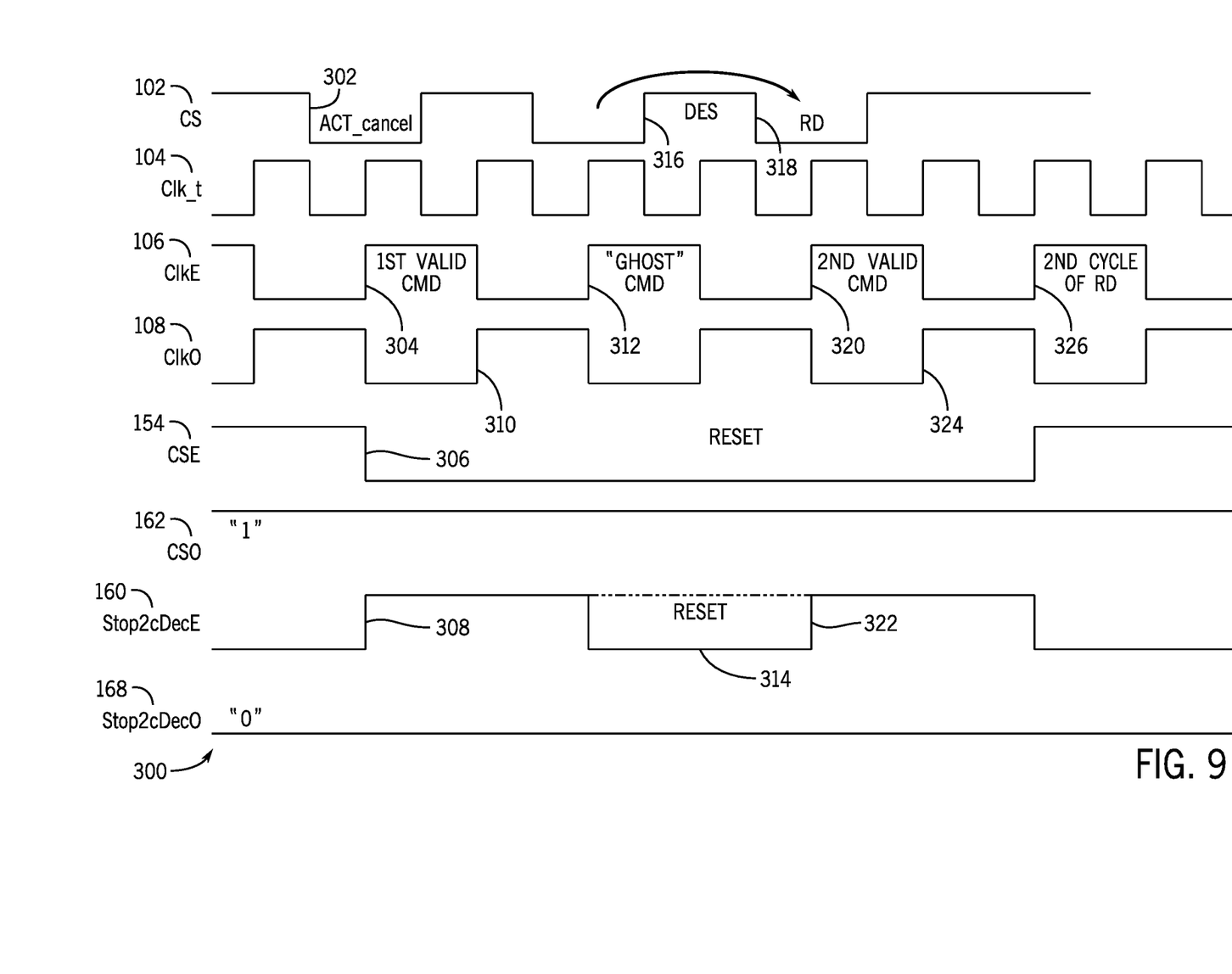
FIG. 9 is a timing diagram for the memory device of FIG. 1 receiving multiple commands in a 2N mode, in accordance with an embodiment.

FIG. 9 is a timing diagram 300 for a memory device 10 receiving multiple commands in a 2N mode. The chip select signal 102 is asserted in pulse 302 for an activate cancel command. In a next pulse 304 of the even clock 106, at least part of the bits of the valid command are captured and the even chip select signal 154 is asserted. Since the one or more CA bits are held to the value and the even chip select signal 154 is asserted, the mask circuitry 50 generates a pulse 308 on the even mask signal 160 to block a ghost command from being decoded in a next even clock cycle 312 even though the even chip select signal 154 remains asserted. The intervening cycle 310 of the odd clock 108 is skipped due to 2N mode. After the ghost command has been suppressed, the even mask signal 160 is reset using deassertion 314. The deassertion 314 is used to clear the even mask signal 160 in preparation for a next valid signal. The chip select signal 102 may transition high during this reset as part of a deselect command 316 that is followed by a pulse 318 of the chip select signal 102 corresponding to a read command. The pulse 318 is received at pulse 320 of the even clock 106 and used to sustain the pulse 306. The even mask signal 160 is reasserted via pulse 322 to block decoding of a ghost command in the $2^{nd}$ cycle 326 of the read command. A next cycle 324 of the odd clock 108 is skipped due to the 2N mode. After a mask signal to suppress the ghost command is generated, the even mask signal 160 may be reset for a next valid command.

Figure 10:
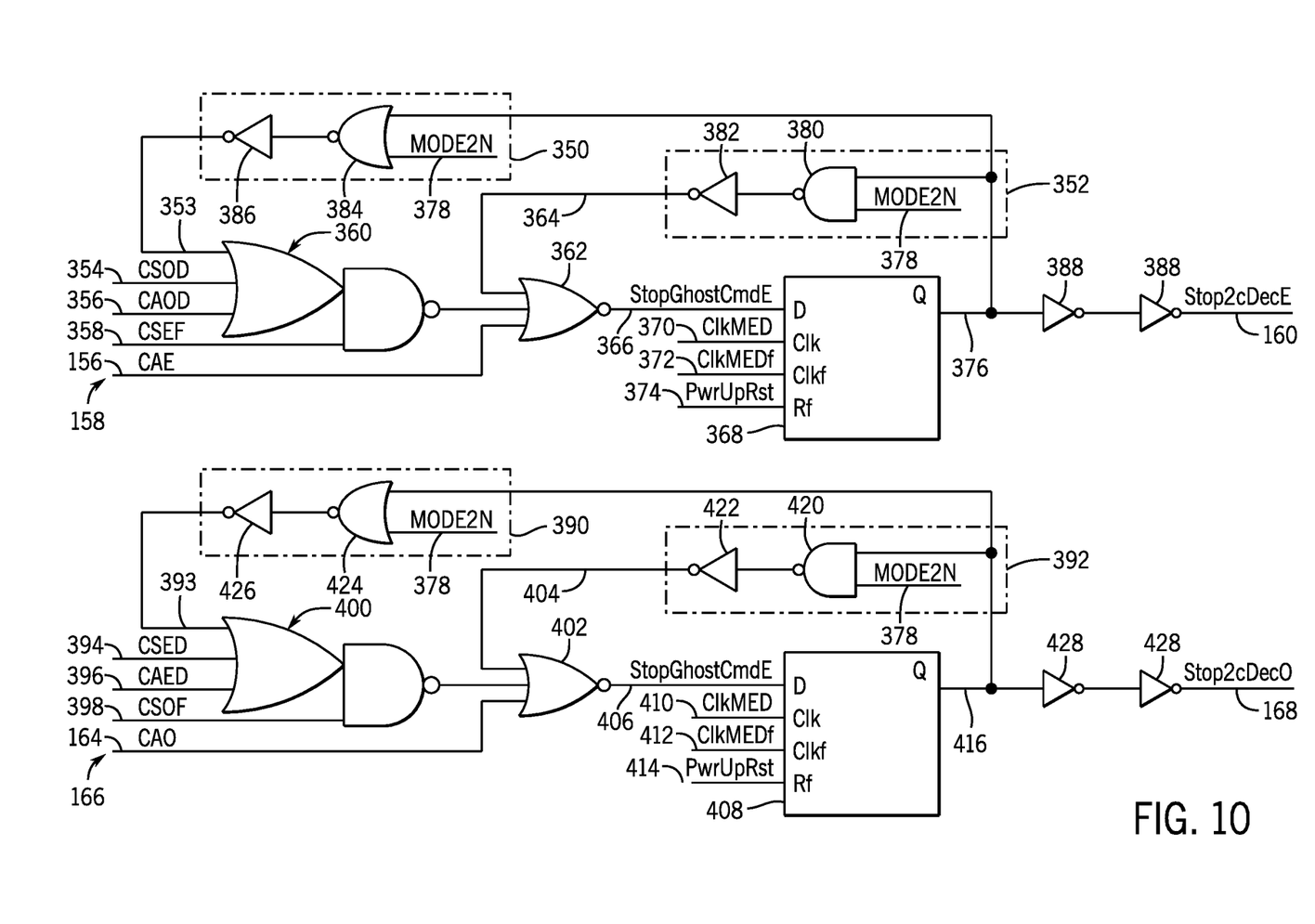
FIG. 10 is a circuit diagram of the mask generation circuitry of FIG. 4, in accordance with an embodiment.

FIG. 10 is a circuit diagram of embodiments of the mask generation circuits 158 and 166 of FIG. 4. As illustrated, the mask generation circuit 158 of the even pipeline 150 includes 1N mode history circuitry 350 and 2N mode history circuitry 352. The mask generation circuit 158 receives a feedback value 353 from the 1N mode history circuitry 350, a delayed odd chip select signal 354, one or more delayed odd CA bits 356, and an inverted even chip select signal 358 at selection circuitry 360. An output of the selection circuitry 360 is transmitted to a NOR gate 362. The NOR gate 362 also receives one or more even command address bits 156. The NOR gate 362 also receives a feedback value 364 from the 2N mode history circuitry 352. An output 366 (StopGhostCmdE) of the NOR gate 362 is transmitted to an input of a flip-flop 368. The flip-flop 368 also receives delayed or undelayed even clock 370 and delayed or undelayed inverted even clock 372. The flip-flop 368 may also receive a reset signal 374 upon a restart of the memory device 10.

An output 376 of the flip-flop 368 is fed back to the 1N mode history circuitry 350 and the 2N mode history circuitry 352. The 2N mode history circuitry 352 also receives a mode2N selection signal 378 at a NAND gate 380. The mode2N selection signal 378 is used to indicate whether the memory device 10 is in a 1N or 2N mode. The output of the NAND gate 380 is inverted in inverter 382 to generate the feedback value 364.

The output 376 is also fed back to a NOR gate 384 of the 1N mode history circuitry 350 with the mode2N selection signal 378. The output of the NOR gate 384 is inverted via inverter 386 to generate the feedback value 353. The output 376 may also be inverted and/or amplified in inverter(s) 388 to generate the even mask signal 160.

The mask generation circuit 158 of the even pipeline 150 includes 1N mode history circuitry 350 and 2N mode history circuitry 352. The mask generation circuit 158 receives a feedback value 353 from the 1N mode history circuitry 350, a delayed odd chip select signal 354, one or more delayed odd CA bits 356, and an inverted even chip select signal 358 at selection circuitry 360. An output of the selection circuitry 360 is transmitted to a NOR gate 362. The NOR gate 362 also receives one or more even command address bits 156. The NOR gate 362 also receives a feedback value 364 from the 2N mode history circuitry 352. An output 366 (StopGhostCmdE) of the NOR gate 362 is transmitted to an input of a flip-flop 368. The flip-flop 368 also receives delayed or undelayed even clock 370 and delayed or undelayed inverted even clock 372. The flip-flop 368 may also receive a reset signal 374 upon a restart of the memory device 10.

An output 376 of the flip-flop 368 is fed back to the 1N mode history circuitry 350 and the 2N mode history circuitry 352. The 2N mode history circuitry 352 also receives a mode2N selection signal 378 at a NAND gate 380. The mode2N selection signal 378 is used to indicate whether the memory device 10 is in a 1N or 2N mode. The output of the NAND gate 380 is inverted in inverter 382 to generate the feedback value 364.

The output 376 is also fed back to a NOR gate 384 of the 1N mode history circuitry 350 with the mode2N selection signal 378. The output of the NOR gate 384 is inverted via inverter 386 to generate the feedback value 353. The output 376 may also be inverted and/or amplified in inverter(s) 388 to generate the even mask signal 160.

The mask generation circuit 166 of the odd pipeline 152 includes 1N mode history circuitry 390 and 2N mode history circuitry 392. The mask generation circuit 166 receives a feedback value 393 from the 1N mode history circuitry 390, a delayed even chip select signal 394, one or more delayed even CA bits 396, and an inverted odd chip select signal 398 at selection circuitry 400. An output of the selection circuitry 400 is transmitted to a NOR gate 402. The NOR gate 402 also receives one or more even command address bits 156. The NOR gate 402 also receives a feedback value 404 from the 2N mode history circuitry 392. An output 406 (StopGhostCmdO) of the NOR gate 402 is transmitted to an input of a flip-flop 408. The flip-flop 408 also receives delayed or undelayed odd clock 410 and delayed or undelayed inverted odd clock 412. The flip-flop 408 may also receive a reset signal 414 upon a restart of the memory device 10.

An output 416 of the flip-flop 408 is fed back to the 1N mode history circuitry 390 and the 2N mode history circuitry 392. The 2N mode history circuitry 392 also receives a mode2N selection signal 378 at a NAND gate 420. The mode2N selection signal 378 is used to indicate whether the memory device 10 is in a 1N or 2N mode. The output of the NAND gate 420 is inverted in inverter 422 to generate the feedback value 404.

The output 416 is also fed back to a NOR gate 424 of the 1N mode history circuitry 390 with the mode2N selection signal 378. The output of the NOR gate 424 is inverted via inverter 426 to generate the feedback value 393. The output 416 may also be inverted and/or amplified in inverter(s) 428 to generate the odd mask signal 168.

Figure 11:
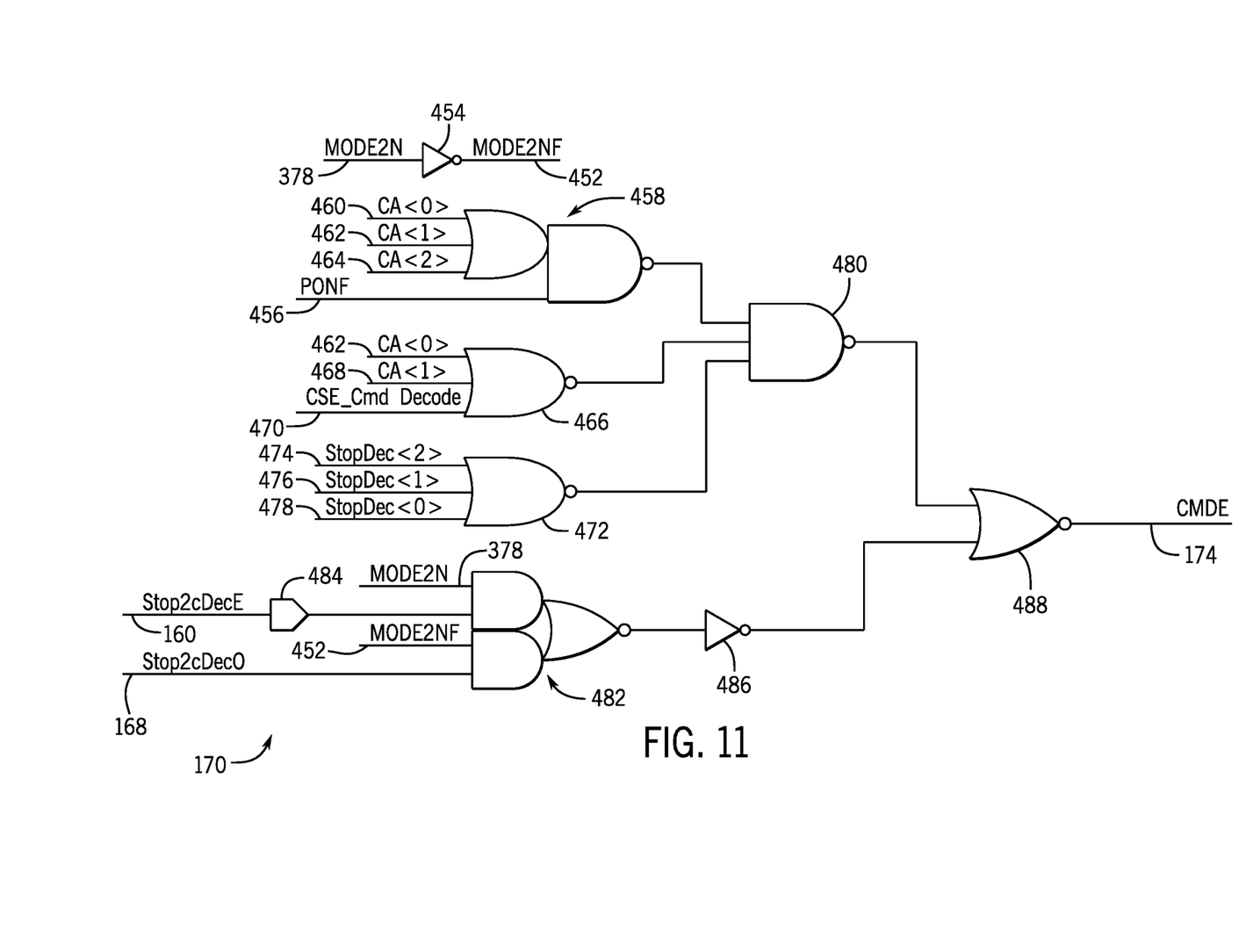
FIG. 11 is a circuit diagram of the multiplexer circuitry of FIG. 4 for an even pipeline, in accordance with an embodiment.

FIG. 11 is a circuit diagram of the multiplexer circuit 170 of FIG. 4. The multiplexer circuit 170 receives the mode2N selection signal 378 and generates an inverted mode2N selection signal 452 using an inverter 454. The multiplexer circuit 170 also receives a power down (PDNF) signal 456 that indicates that certain bits (e.g., CA<0> bit 460, CA<1> bit 462, and/or CA<3> bit 464) are not to be decoded. The PDNF signal 456, the CA<0> bit 460, CA<1> bit 462, and the CA<3> bit 464 are received at selection circuitry 458. The CA<1> bit 462, a CA<4> bit 468, and a chip select even decode signal 470 are transmitted to a NOR gate 466. A NOR gate 472 receives disable decoding bits 474, 476, and 478 to disable decoding based on the disable decoding bits 474, 476, and 478. Outputs from the selection circuitry 458, NOR gate 466, and NOR gate 472 are transmitted to a NAND gate 480.

A 2:1 multiplexer 482 receives mask signals 160 and 168 and selects between the mask signals 160 and 168 based on whether mode N1 or N2 is selected as indicated by the mode2N selection signal 378 and/or the inverted mode2N selection signal 452. At least one of the mask signals (e.g., even mask signal 160) is delayed in delay 484. Since the multiplexer circuit 170 is deployed in the even pipeline, if the memory device 10 is in an N1 mode, the odd mask signal 168 for the odd pipeline is selected. Instead, if the memory device 10 is in an N2 mode, the even mask signal 160 for the even pipeline is selected. The selected mask signal is output from the 2:1 multiplexer 482 to an inverter 486. The output of the inverter 486 is transmitted to a NOR gate 488 along with an output of the NAND gate 480. The output of the NOR gate 488 is the command decode even 174.

Figure 12:
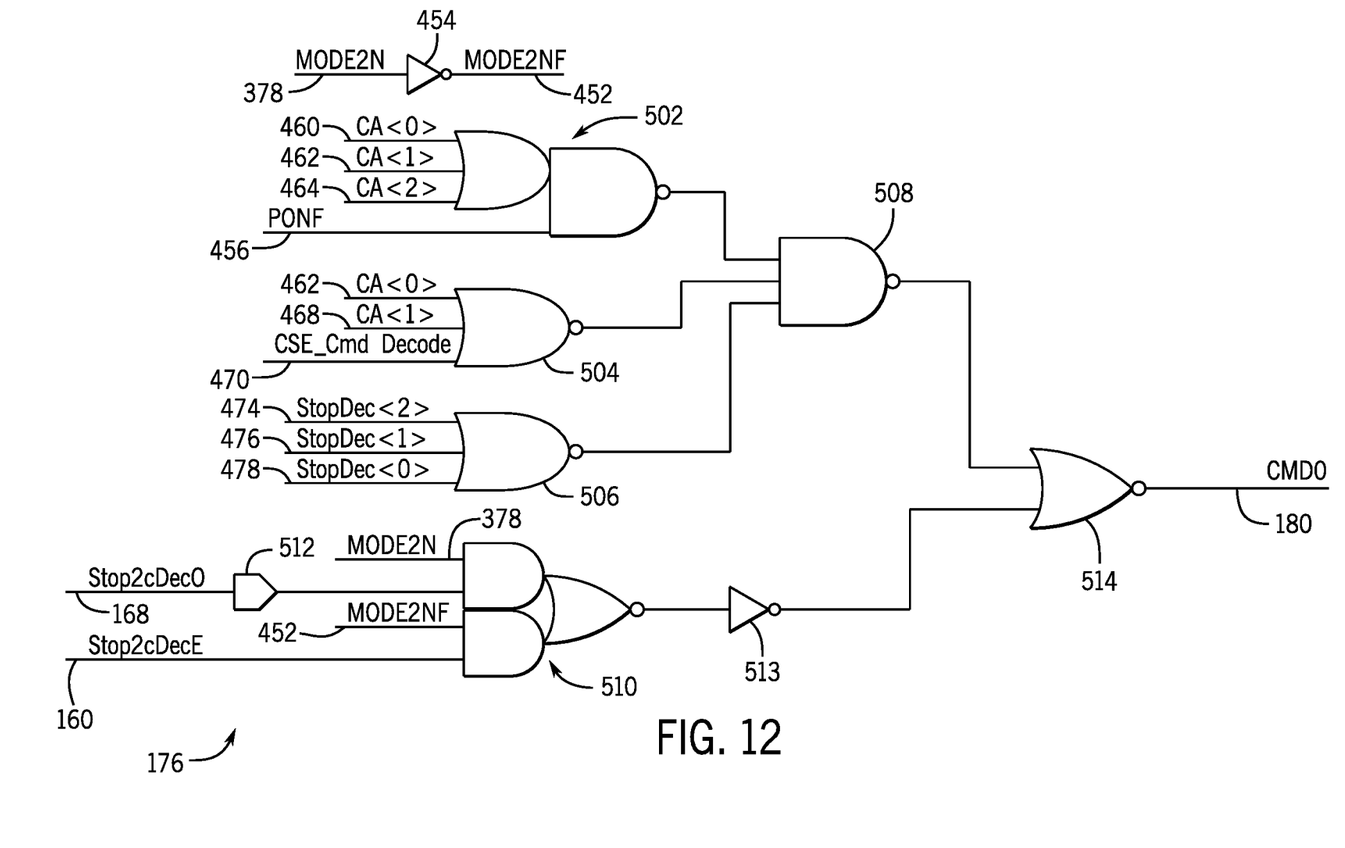
FIG. 12 is a circuit diagram of the multiplexer circuitry of FIG. 4 for an odd pipeline, in accordance with an embodiment.

FIG. 12 is a circuit diagram of the multiplexer circuit 176 of FIG. 4. The multiplexer circuit 176 receives the mode2N selection signal 378 and generates the inverted mode2N selection signal 452 using an inverter 454. In some embodiments, the multiplexer circuit 176 may not be used to locally generate the inverted mode2N selection signal 452 but rather receives the inverted mode2N selection signal 452 from outside of the multiplexer circuit 176. The multiplexer circuit 176 also receives the power down (PDNF) signal 456 that indicates that certain bits (e.g., CA<0> bit 460, CA<1> bit 462, and/or CA<3> bit 464) are not to be decoded. The PDNF signal 456, the CA<0> bit 460, CA<1> bit 462, and the CA<3> bit 464 are received at selection circuitry 502. The CA<1> bit 462, a CA<4> bit 468, and a chip select even decode signal 470 are transmitted to a NOR gate 504. A NOR gate 506 receives disable decoding bits 474, 476, and 478 to disable decoding based on the disable decoding bits 474, 476, and 478. Outputs from the selection circuitry 502, NOR gate 504, and NOR gate 506 are transmitted to a NAND gate 508.

A 2:1 multiplexer 510 receives mask signals 160 and 168 and selects between the mask signals 160 and 168 based on whether mode N1 or N2 is selected as indicated by the mode2N selection signal 378 and/or the inverted mode2N selection signal 452. At least one of the mask signals (e.g., odd mask signal 168) is delayed in delay 512. Since the multiplexer circuit 176 is deployed in the odd pipeline, if the memory device 10 is in an N1 mode, the even mask signal 160 for the even pipeline is selected. Instead, if the memory device 10 is in an N2 mode, the odd mask signal 168 for the odd pipeline is selected. The selected mask signal is output from the 2:1 multiplexer 510 to an inverter 513. The output of the inverter 513 is transmitted to a NOR gate 514 along with an output of the NAND gate 508. The output of the NOR gate 514 is the command decode odd 180.

While the present disclosure may be susceptible to various modifications and alternative forms, specific embodiments have been shown by way of example in the drawings and have been described in detail herein. However, it should be understood that the present disclosure is not intended to be limited to the particular forms disclosed. For instance, logical polarities may be reversed. Additionally or alternatively, equivalent circuits may be used. For instance, a NAND gate and inverter may be replaced with an AND gate. Indeed, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a command interface configured to receive a two-cycle command from a host device via a plurality of command address bits; and
   a command decoder configured to decode a first portion of the plurality of command address bits in a first cycle of the two-cycle command and comprises mask circuitry, comprising:
   mask generation circuitry configured to generate a mask signal; and
   multiplexer circuitry configured to apply the mask signal to block the command decoder from decoding a second portion of the plurality of command address bits in a second cycle of the two-cycle command.

2. The memory device of claim 1, wherein the command decoder comprises two pipelines that each operate at a frequency half that of a system clock corresponding to the first and second cycles.

3. The memory device of claim 2, wherein a first pipeline of the two pipelines comprises the mask generation circuitry and the multiplexer circuitry, and the mask signal is configured to block the second pipeline from decoding the second portion.

4. The memory device of claim 3, wherein the two pipelines operate in a 2N mode where both the first and second cycles of the two-cycle command are pipelined in the first pipeline in nonconsecutive cycles of the system clock.

5. The memory device of claim 3, wherein a second pipeline of the two pipelines comprises:
additional mask generation circuitry configured to generate an additional mask signal; and
additional multiplexer circuitry configured to apply the additional mask signal to block the second pipeline from decoding a plurality of command address bits in a second cycle of an additional two-cycle command.

6. The memory device of claim 5, wherein the multiplexer circuitry is configured to receive the additional mask signal and the mask signal and to select the mask signal for application to the first pipeline.

7. The memory device of claim 2, wherein a first pipeline of the two pipelines comprises the mask generation circuitry and the multiplexer circuitry, and the mask signal is configured to block a second pipeline of the two pipelines from decoding the second portion.

8. The memory device of claim 7, wherein the two pipelines operate in a 1N mode where the first cycle of the two-cycle command is pipelined in the first pipeline, and the second cycle of the two-cycle command is pipelined in the second pipeline in consecutive cycles of the system clock.

9. The memory device of claim 7, wherein the second pipeline of the two pipelines comprises:
additional mask generation circuitry configured to generate an additional mask signal; and
additional multiplexer circuitry configured to apply the additional mask signal to block the first pipeline from decoding a plurality of command address bits in a second cycle of an additional two-cycle command.

10. The memory device of claim 9, wherein the multiplexer circuitry is configured to receive the additional mask signal and the mask signal and to select the additional mask signal for application to the first pipeline.

11. The memory device of claim 1, wherein the mask generation circuitry is configured to generate the mask signal based at least in part on one of the command address bits in a prior cycle of a system clock corresponding to the first and second cycles prior to the first cycle.

12. The memory device of claim 1, wherein the mask generation circuitry is configured to generate the mask signal based at least in part on one of the command address bits in a prior cycle of a system clock that is two cycles prior to the first cycle, wherein the system clock corresponds to the first and second cycles.

13. The memory device of claim 1, wherein the mask generation circuitry is configured to generate the mask signal based at least in part on a chip select signal.

14. A memory device, comprising:
a command interface configured to receive a two-cycle command from a host device via plurality of command address bits; and
a command decoder configured to decode a first portion of the plurality of command address bits in a first cycle of the two-cycle command, comprising:
a first pipeline comprising:
first mask generation circuitry configured to generate a first mask signal;
first multiplexer circuitry configured to apply the first mask signal to block the command decoder from decoding a second portion of the plurality of command address bits in a second cycle of the two-cycle command when the first cycle is received in the first pipeline, wherein the first pipeline operates using an even clock oscillating at half a frequency of a system clock containing the first and second cycles; and
a second pipeline comprising:
second mask generation circuitry configured to generate a second mask signal; and
second multiplexer circuitry configured to apply the second mask signal to block the command decoder from decoding the second portion of the plurality of command address bits in a second cycle of the two-cycle command when the first cycle is received in the second pipeline, wherein the second pipeline operates using an odd clock oscillating at half a frequency of the system clock.

15. The memory device of claim 14, wherein the first multiplexer circuitry is configured to:
receive the first mask signal and the second mask signal; and
select the first mask signal for the first pipeline when the first and second pipelines operate in a 2N mode where both the first and second cycles of the two-cycle command are pipelined in the first pipeline in nonconsecutive cycles of the system clock or both pipelined in the second pipeline in nonconsecutive cycles of the system clock.

16. The memory device of claim 15, wherein the second multiplexer circuitry is configured to:
receive the first mask signal and the second mask signal; and
select the second mask signal for the second pipeline when the first and second pipelines operate in the 2N mode.

17. The memory device of claim 14, wherein the first multiplexer circuitry is configured to:
receive the first mask signal and the second mask signal; and
select the second mask signal for the first pipeline when the first and second pipelines operate in a 1N mode where one of the first or second cycles of the two-cycle command is pipelined in the first pipeline and the other is pipelined in the second pipeline in consecutive cycles of the system clock.

18. The memory device of claim 17, wherein the first multiplexer circuitry is configured to:
receive the first mask signal and the second mask signal; and
select the first mask signal for the second pipeline when the first and second pipelines operate in the 1N mode.

19. A method comprising:
receiving a first portion of a plurality of command address bits at a command interface in a first cycle of a system clock;
determining, using mask generation circuitry of a memory device, whether a command corresponding to the plurality of command address bits is a valid two-cycle command or is a second cycle of a two-cycle command; and
based on the determination that the command is a valid two-cycle command, asserting a mask signal in the mask generation circuitry, wherein assertion of the mask signal is configured to block decoding of a second portion of the plurality of command address bits received during a second cycle of the system clock corresponding to the two-cycle command.

20. The method of claim 19, comprising selecting between the mask signal and an additional mask signal in multiplexer circuitry, wherein the mask generation circuitry and the multiplexer circuitry are in a first pipeline of two pipelines in the memory device, and the multiplexer circuitry receives the mask signal from the first pipeline and the additional mask signal from a second pipeline.

21. The method of claim 20, wherein selecting between the mask signal and the additional mask signal comprises selecting the mask signal when the first and second pipelines operate in a 2N mode where both the first and second cycles of the two-cycle command are pipelined in the first pipeline in nonconsecutive cycles of the system clock or both pipelined in the second pipeline in nonconsecutive cycles of the system clock.

22. The method of claim 20, wherein selecting between the mask signal and the additional mask signal comprises selecting the additional mask signal when the first and second pipelines operate in a 1N mode where one of the first or second cycles of the two-cycle command is pipelined in the first pipeline and the other is pipelined in the second pipeline in consecutive cycles of the system clock.

23. The method of claim 20, wherein when the command interface is configured to operate in a half-frequency design with a first pipeline and a second pipeline, determining whether the command corresponding to the plurality of command address bits is a valid two-cycle command or a second cycle of a two-cycle command comprises checking a two-cycle history.

24. The method of claim 23, wherein the first and second pipelines are in a 1N mode, and checking the two-cycle history for a command to be received in the first command comprises checking a one-cycle history of the second pipeline and a two-cycle history of the first pipeline.

25. The method of claim 23, wherein the first and second pipelines are in a 2N mode, and checking the two-cycle history for a command to be received in the first command comprises checking a two-cycle history for the first pipeline.

* * * * *